United States Patent [19]

Guevel et al.

[11] Patent Number: 4,825,635
[45] Date of Patent: May 2, 1989

[54] CARBON FIBER YARN

[75] Inventors: Jean Guevel, Viriat; Marc Francois; Guy Bontemps, both of Tenay, all of France

[73] Assignee: S. A. Schappe, Saint-Rembert-en-Bugey, France

[21] Appl. No.: 133,724

[22] Filed: Dec. 15, 1987

[30] Foreign Application Priority Data

Dec. 18, 1986 [FR] France ............................. 86 18384

[51] Int. Cl.$^4$ ............................................. D02G 3/02
[52] U.S. Cl. .......................................... 57/315; 57/200
[58] Field of Search ................. 57/200, 240, 243, 249, 57/315, 236; 428/367

[56] References Cited

U.S. PATENT DOCUMENTS

| | | | |
|---|---|---|---|
| 3,841,079 | 10/1974 | Ram | 57/243 |
| 4,051,659 | 10/1977 | Blakelock | 57/243 |
| 4,159,618 | 7/1979 | Sokaris | 57/249 X |
| 4,219,996 | 9/1980 | Edgawa | 57/243 X |
| 4,444,574 | 4/1984 | Tradewell et al. | |
| 4,520,623 | 6/1965 | Ogawa | 57/243 |

FOREIGN PATENT DOCUMENTS 2322223  3/1977  France .

OTHER PUBLICATIONS

B. Von Falkai: "Synthesefasern", 1981, pp. 247–268, Verlag Chemie, Weinheim, DE* p. 267, Colonne de gauche—Colonne de droite, Line 25.

Primary Examiner—Donald Watkins
Attorney, Agent, or Firm—Browdy and Neimark

[57] ABSTRACT

A process is provided for producing carbon fiber yarns which comprise an intimate association of carbon fibers having an average length of between 100 and 120 mm. The process comprises transforming tows of multifilaments whose count is between 0.5 and 1 dtex by cracking, by drawing, and controlled breaking to obtain long fibers having an average length of between 100 and 120 mm. These fibers are then transformed on standard spinning equipment for long fibers into a range of yarns which have counts ranging from Mn 1 to Mn 100. The yarns of the present invention can be used for making prepreg fabrics for composites, fabrics for dry and wet filtration, fabrics for making Faraday shields, fabrics for carbonization for carbon/carbon pieces and high-performance seals.

3 Claims, 1 Drawing Sheet

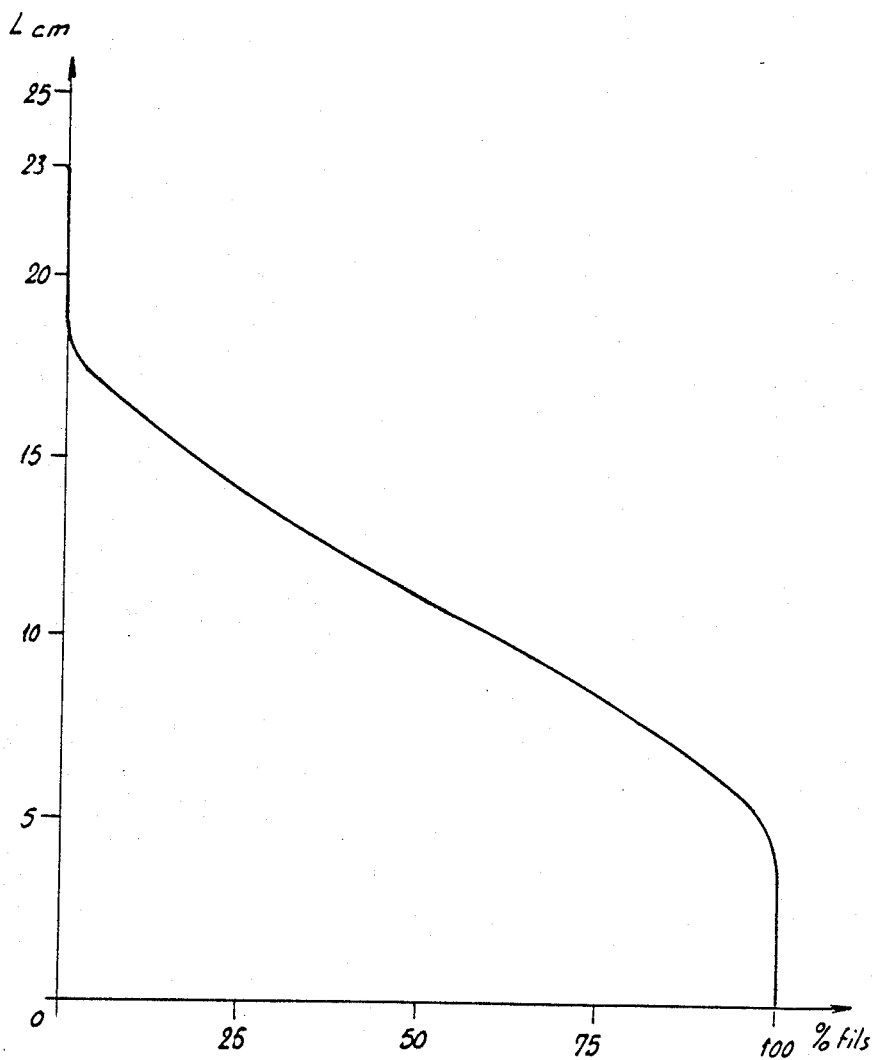

CARBON FIBER YARN

FIELD OF THE INVENTION

This invention relates to a carbon fiber yarn.

BACKGROUND OF THE INVENTION

Carbon fibers are well known by their applications to technical use; in particular, they find numerous uses in composite materials.

There are two types of carbon on the market, sold as continuous multifilaments in the following counts:

| Number of filaments | Metric number |
| --- | --- |
| 3K (K = 10³) | 5.12 |
| 6K | 2.56 |
| 12K | 1.28 |
| 40K | 0.38 |

These two types of carbon are differentiated by their physical properties:

| (HM) | High Strength (HS) | High Modulus |
| --- | --- | --- |
| Carbon content | 97% | 99.5% |
| Strength | 3.3 GPa | 2.2 GPa |
| Young's modulus | 230 GPa | 335 GPa |
| Breaking elongation | 1.55% | 0.75% |
| Density | 1.78 | 1.86 |
| Diameter of fibers | 6.8 microns | 6.6 microns |

The variety of counts proposed by the producers therefore is very limited.

Moreover, the filaments are in the form of very smooth flat ribbons which pose problems with regard to stability of nets made from these fibers, in particular in the case where the product is woven.

At present there are no carbon fiber yarns on the market which meet the needs of many different sectors, and particularly which have a wide range of fine counts which do not exist in multifilaments.

Actually, the only cut carbon fibers which are now encountered comprise fibers of very small dimensions, which are obtained by mechanical cutting with a knife and which in no case are able to be joined to constitute fiber yarns.

SUMMARY OF THE INVENTION

The application has surprisingly succeeded in developing carbon fibers whose average length is 100 and 120 mm and which make it possible to obtain fiber yarns in a range of metric numbers between Mn 1 and Mn 100.

BRIEF DESCRIPTIONS OF THE DRAWING

The single FIGURE of the accompanying diagrammatic drawing is a diagram of the lengths of fibers according to the invention according to an increasing distribution of lengths. The lengths in centimeters are plotted as Y axes and the population of fibers expressed in percentage of the number of yarns of this population is plotted as the X axis.

It is seen that the average is located around 100 mm.

DETAILED DESCRIPTION OF THE INVENTION

The process of producing carbon fiber yarns according to the present invention consists in transforming fibers, according to a process of cracking by drawing and controlled breaking, of tows of multifilaments whose count is between 0.5 and 1 dtex to obtain long fibers whose average length is, as mentioned above, between 100 and 120 mm, the longest fibers reaching 180 mm.

These long fibers can then be transformed on standard spinning equipment for long fibers into a range of yarns whose counts are between Mn 1 and Mn 100.

The complementary operations of finishing are performed such as twisting with 2, 3 or x pieces.

The single yarns can be used in the condition in which they leave the spinning after winding.

Relative to the starting filaments, the resulting yarns retain about 70% of the mechanical properties. On the other hand, on the same score, the apparent volume of the yarns is greater than that of continuous filaments, and of circular section.

The new carbon fiber yarns according to the invention find very numerous applications in different sectors, such as prepreg fabrics for composites, fabrics for dry and wet filtration and fabrics for making Faraday shields (electrical resistance : 1 microohm.m).

The carbon fiber yarns of the present invention are also very suitable for making fabrics intended for carbonization for carbon/carbon pieces.

Actually, the loss of 3% as opposed to the 35% obtained by starting with preoxidized yarns at 65% of carbon makes possible a saving of time, of use and of material (brakes, gears, friction parts, internal-combustion engine nozzles, various parts that must resist high temperatures).

Finally, the carbon fiber yarns of the present invention can be used to make high-performance seals on steam or superheated water circuits (450° C.).

The carbon fiber yarn according to the invention in comparison with continuous filaments offers the following advantages:

better adaptation of the yarn counts for the required uses, in particular, existence of a wide range of fine counts which do not exist in multifilaments;

great volume with the identical counts;

price lower than continuous filaments in fine counts.

The foregoing description of the specific embodiments will so fully reveal the general nature of the invention that others can, by applying current knowledge, readily modify and/or adapt for various applications such specific embodiments without departing from the generic concept, and therefore such adaptations and modifications are intended to be comprehended within the meaning and range of equivalents of the disclosed embodiments. It is to be understood that the phraseology or terminology employed herein is for the purpose of description and not of limitation.

What is claimed is:

1. A process for the production of carbon fiber yarns which comprise an intimate association of carbon fibers, comprising:

transforming tows of multifilaments by cracking by drawing and controlled breaking, said multifilaments having a count between 0.5 and 1 dtex; to obtain long fibers having an average length of between 100 and 120 mm;

transforming said long fibers on standard spinning equipment for long fibers into a range of yarns having counts between 1 Mn and 100 Mn.

2. The process according to claim 1 wherein the fibers are twisted together with at least two pieces.

3. The yarn made according to the process of claim 1.

* * * * *